(12) United States Patent
Fujikawa et al.

(10) Patent No.: US 9,683,128 B2
(45) Date of Patent: Jun. 20, 2017

(54) POLYMERIZED FILM FORMING METHOD

(71) Applicant: TOKYO ELECTRON LIMITED, Tokyo (JP)

(72) Inventors: Makoto Fujikawa, Nirasaki (JP); Tatsuya Yamaguchi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 93 days.

(21) Appl. No.: 14/625,288

(22) Filed: Feb. 18, 2015

(65) Prior Publication Data
US 2015/0240120 A1    Aug. 27, 2015

(30) Foreign Application Priority Data

Feb. 21, 2014    (JP) ................. 2014-031645

(51) Int. Cl.
  *C23C 16/02*    (2006.01)
  *C09D 179/08*    (2006.01)
  (Continued)

(52) U.S. Cl.
  CPC ........ *C09D 179/08* (2013.01); *C23C 16/4412* (2013.01); *C23C 16/455* (2013.01); *C23C 16/46* (2013.01); *C23C 16/52* (2013.01)

(58) Field of Classification Search
  CPC ..... C23C 16/02; C23C 16/18; C23C 16/0272; C08J 7/06
  See application file for complete search history.

(56) References Cited

U.S. PATENT DOCUMENTS 4,749,777 A * 6/1988 Kohtoh ............... C08G 73/10
                                                        252/299.01
6,610,815 B1 * 8/2003 Hata .................... C08G 73/10
                                                        430/283.1
(Continued)

FOREIGN PATENT DOCUMENTS

JP    2012-204518 A    10/2012
JP    5131519    * 11/2012
(Continued)

OTHER PUBLICATIONS

Keum, Dongki, et al., "Synthesis and Characterization of Aromatic Dianhydrides Containng Imide Precursor Units". Bull. Korean Chem. Soc. 1999, vol. 20, No. 5, pp. 505-507.*
(Continued)

*Primary Examiner* — Bret Chen
(74) *Attorney, Agent, or Firm* — Nath, Goldberg & Meyer; Jerald L. Meyer

(57) ABSTRACT

A polymerized film forming method for forming a polymerized film on a target surface of a target object by using a first raw material gas containing acid dianhydride and a second raw material gas containing diamine, the method comprising performing a surface treatment on the target surface by supplying a gas containing an adhesion promoting agent for enhancing adhesion between the target surface and the polymerized film, and supplying the first raw material gas and the second raw material gas to the surface-treated target surface to form the polymerized film, wherein when performing the surface treatment, at least one of the first raw material gas and the second raw material gas is supplied in addition to the gas containing the adhesion promoting agent.

10 Claims, 17 Drawing Sheets

(51) Int. Cl.
*C23C 16/455* (2006.01)
*C23C 16/44* (2006.01)
*C23C 16/52* (2006.01)
*C23C 16/46* (2006.01)

(56) References Cited

U.S. PATENT DOCUMENTS

| | | | | |
|---|---|---|---|---|
| 6,911,265 | B2* | 6/2005 | Nishinaka | B32B 15/08 428/344 |
| 2004/0157994 | A1* | 8/2004 | Kubo | C08F 8/00 525/88 |
| 2008/0044681 | A1* | 2/2008 | Yamaguchi | C08G 73/1042 428/626 |
| 2008/0305346 | A1* | 12/2008 | Yanagida | B32B 15/08 428/473.5 |
| 2009/0068454 | A1* | 3/2009 | Murakami | B32B 15/08 428/337 |
| 2009/0154790 | A1* | 6/2009 | Narabayashi | G01B 11/24 382/149 |
| 2012/0101236 | A1* | 4/2012 | Sakumoto | C08G 73/10 525/426 |
| 2013/0316545 | A1* | 11/2013 | Yamaguchi | H01L 21/02118 438/781 |
| 2013/0344310 | A1* | 12/2013 | Wasserfallen | B05D 7/142 428/216 |

FOREIGN PATENT DOCUMENTS

| | | | |
|---|---|---|---|
| JP | 2013-247285 | A | 12/2013 |
| JP | 2013-247287 | A | 12/2013 |
| JP | 5468913 | * | 2/2014 |
| JP | 2014-145115 | A | 8/2014 |
| JP | 2014-150144 | A | 8/2014 |
| JP | 2014-154682 | A | 8/2014 |
| JP | 2014-093331 | A | 9/2014 |
| JP | 5632426 | * | 10/2014 |
| TW | 201000522 | A1 | 1/2010 |
| TW | 201305384 | A1 | 2/2013 |

OTHER PUBLICATIONS

Xu, Bubin, et al., "Polyimides from diamine-acid salts and tetracarboxylic dianhydrides". Macromol. Rapid Commun. 21, 481-484 (2000).*

Iida, Kazuo, et al., "Preparation of Polyimide Films by Vapor Deposition Polymerization and Their Photocurrents". Proceedings of the Twenty-First Symposium on Electrical Insulating Materials (1988), p. 227-230.*

* cited by examiner

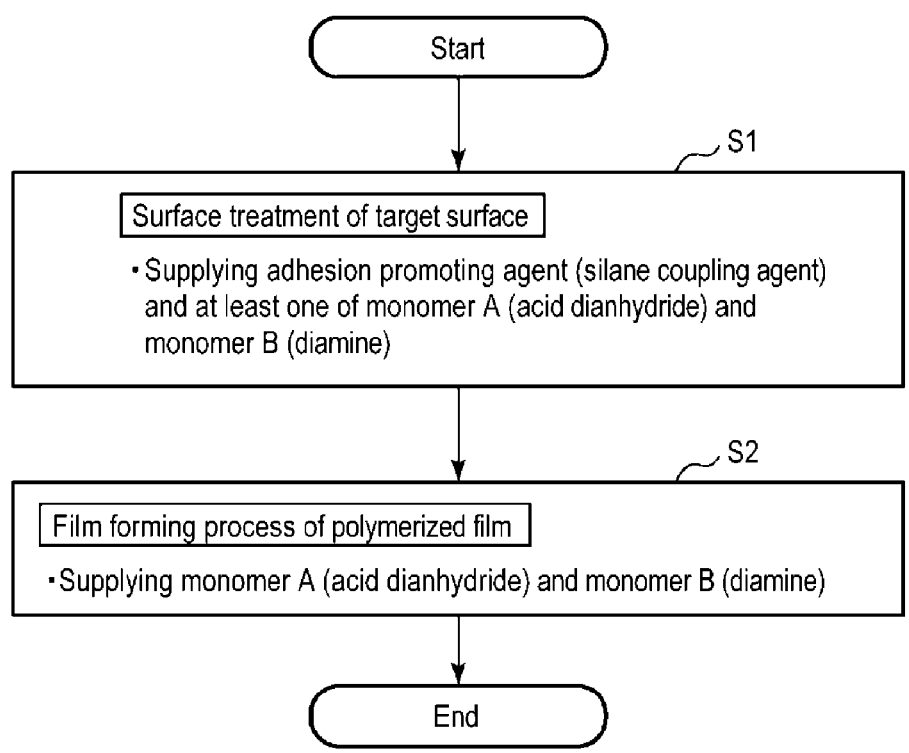

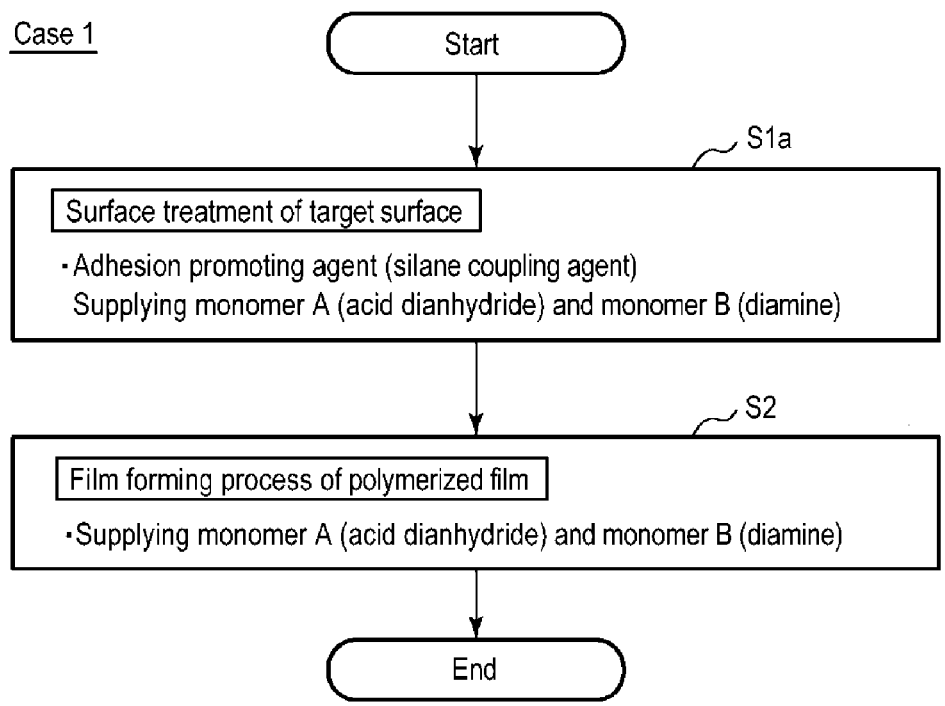

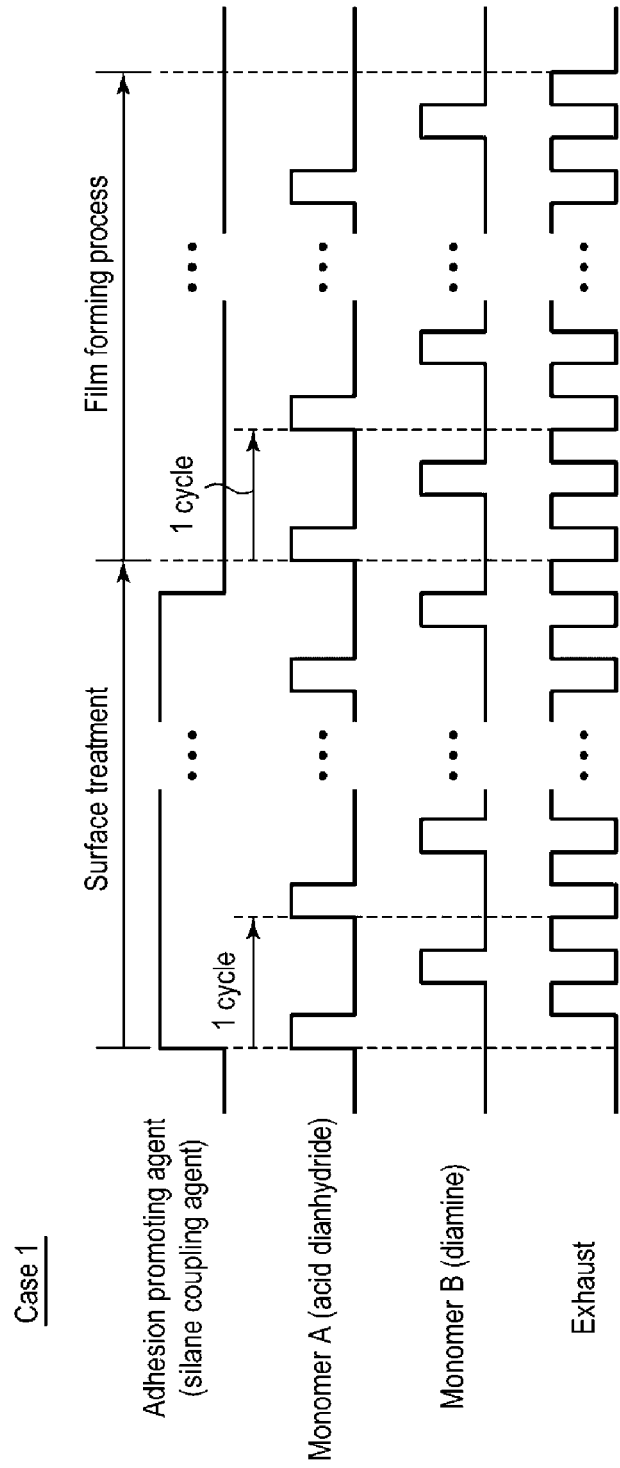

FIG. 11

| Temperature of forming polymerized film | Comparative Example | Case 1 | Case 2 | Case 3 |
|---|---|---|---|---|
| 150 °C | 60% | 70% | 98% | 100% |

FIG. 12

| Temperature of forming polymerized film | Comparative Example | Case 3 (6 cycles) | Case 3 (12 cycles) | Case 3 (25 cycles) | Case 3 (100 cycles) |
|---|---|---|---|---|---|
| 130 °C | 0% | 0% | 0% | 60% | 100% |

N-phenyl-3-aminopropyl trimethoxysilane 3-aminopropyl trimethoxysilane 3-aminopropyl triethoxysilane N-2-(aminoethyl)-3-aminopropyl trimethoxysilane N-2-(aminoethyl)-3-aminopropyl methyldimethoxysilane 3-isocyanate propyltrimethoxysilane 3-glycidoxypropyl trimethoxysilane 3-glycidoxypropyl triethoxysilane 3-glycidoxypropyl methyldimethoxysilane

POLYMERIZED FILM FORMING METHOD

CROSS-REFERENCE TO RELATED APPLICATION(S)

This application claims the benefit of priority to Japanese Patent Application No. 2014-031645, filed on Feb. 21, 2014, in the Japan Patent Office, the disclosure of which is incorporated herein in its entirety by reference.

TECHNICAL FIELD

The present disclosure relates to a polymerized film forming method and a film forming apparatus.

BACKGROUND

It is studied that a polymerized film, e.g., a high-molecular thin film represented by a polyimide thin film, is used as an interlayer insulating film of a semiconductor integrated circuit device or a liquid crystal alignment film of a flat panel display, e.g., a liquid crystal display device.

The high-molecular thin film is formed by using a deposition polymerization method which evaporates a raw material monomer dissolved in a solvent, deposits the evaporated raw material monomer on a surface of a target object, and performs a polymerization reaction on the surface of the target object, and the like. According to the deposition polymerization method, a polymerized film may be formed by using a film forming apparatus which is a semiconductor manufacturing apparatus.

Further, in order to enhance adhesion onto a target surface of the formed polymerized film, e.g., a polyimide film, a surface treatment on the target surface is performed by an adhesion promoting agent such as a silane coupling agent before forming a polymerized film.

According to the foregoing deposition polymerization method, it is possible to enhance adhesion between the polymerized film and the target surface because the target surface is surface-treated by the adhesion promoting agent before forming the polymerized film.

A film forming temperature of a polymerized film is approximately 200 degrees C., but it has been recently further required to lower the film forming temperature of the polymerized film.

However, it has newly been known that if the film forming temperature of the polymerized film is lowered to below 200 degrees C., the adhesion between the polymerized film and the target surface is degraded even though surface treatment is performed with the adhesion promoting agent.

SUMMARY

Some embodiments of the present disclosure provide a polymerized film forming method which can prevent degradation of adhesion between a polymerized film and a target surface even though a film forming temperature of the polymerized film is lowered, and a film forming apparatus capable of implementing the film forming method.

According to one embodiment of the present disclosure, there is provided a polymerized film forming method for forming a polymerized film on a target surface of a target object by using a first raw material gas containing acid dianhydride and a second raw material gas containing diamine, the method comprising: performing a surface treatment on the target surface by supplying a gas containing an adhesion promoting agent for enhancing adhesion between the target surface and the polymerized film; and supplying the first raw material gas and the second raw material gas to the surface-treated target surface to form the polymerized film, wherein when performing the surface treatment, at least one of the first raw material gas and the second raw material gas is supplied in addition to the gas containing the adhesion promoting agent.

According to another embodiment of the present disclosure, there is provided a film forming apparatus for forming a polymerized film on a target surface of a target object by using a first raw material gas containing acid dianhydride and a second raw material gas containing diamine, the apparatus comprising: a processing chamber that accommodates the target object; a gas supply mechanism that supplies the first raw material gas, the second raw material gas, and a gas containing an adhesion promoting agent into the processing chamber; a heating device that heats the target object; an exhaust device that evacuates an interior of the processing chamber; and a controller that controls the gas supply mechanism, the heating device and the exhaust device, wherein the controller controls the gas supply mechanism, the heating device and the exhaust device such that the method discussed in the paragraph above is performed on the target object in the processing chamber.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 1 is a flowchart illustrating an example of a polymerized film forming method according to a first embodiment of the present disclosure.

FIG. 3 is a flowchart illustrating Case 1 of the polymerized film forming method according to the first embodiment of the present disclosure.

FIG. 4 is a timing chart illustrating timing of gas supply and exhaust in Case 1.

FIG. 11 illustrates results of peel test.

FIG. 12 illustrates results of peel test.

DETAILED DESCRIPTION

Figure 2A:
FIG. 2A to 2C are sectional views showing a state of a target object in the sequence shown in FIG. 1.

Hereinafter, some embodiments of the present disclosure will now be described with reference to the accompanying drawings. Throughout the drawings, like reference numerals are used to designate like elements. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

(First Embodiment)

<Film Forming Method>

Figure 2B:
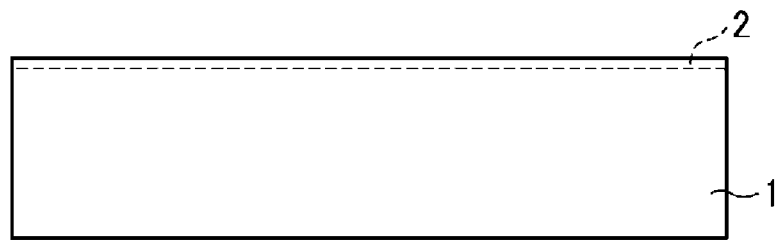
Figure 2C:
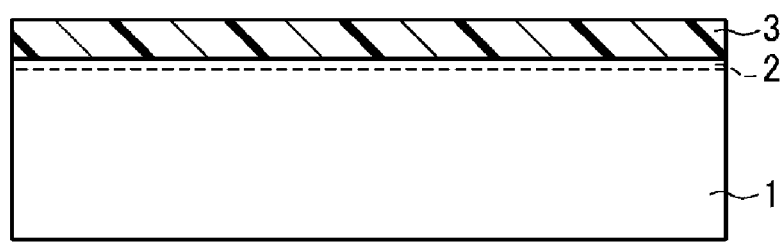

FIG. 1 is a flowchart illustrating an example of a polymerized film forming method according to a first embodiment of the present disclosure. FIGS. 2A to 2C are sectional views illustrating a state of a target object in the sequence shown in FIG. 1.

The polymerized film forming method according to the first embodiment is a polymerized film forming method that forms a polymerized film on a target surface of a target object by using a first raw material gas containing acid dianhydride (hereinafter, referred to as a monomer A) and a second raw material gas containing diamine (hereinafter, referred to as a monomer B).

First, a target object shown in FIG. 2A, e.g., a silicon wafer (hereinafter, referred to as a wafer) 1 is accommodated into a processing chamber of a film forming apparatus. Subsequently, as shown in Step S1 of FIG. 1 and FIG. 2B, a target surface is surface-treated. In the surface treatment, a gas containing an adhesion promoting agent is supplied to the target surface of the wafer 1. An example of the adhesion promoting agent is a silane coupling agent (hereinafter, referred to as an SC agent). In the surface treatment, the film forming method according to this example supplies a gas containing the monomer A and/or a gas containing the monomer B to the target surface, in addition to the gas containing the adhesion promoting agent. Thus, the SC agent turns into a molecular state by the monomer A and/or the monomer B and stays on the target surface. During the stay, the SC agent combines with silicon on the target surface so that the target surface is surface-treated. In FIG. 2B, the reference numeral 2 denotes the surface-treated target surface.

In this manner, because the adhesion promoting agent turns into the molecular state by the monomer A and/or the monomer B, it is possible to lengthen a time during which the adhesion promoting agent stays on the target surface of the wafer 1, compared with a case which does not turn the adhesion promoting agent into molecules. If the staying time on the target surface is lengthened, the probability that the adhesion promoting agent is combined with silicon on the target surface is increased, and thus, even a small amount of adhesion promoting agent may perform a sufficient surface treatment on the target surface.

Subsequently, as shown in Step S2 of FIG. 1 and FIG. 2C, a process of forming a polymerized film is performed. In the film forming process, a gas containing the adhesion promoting agent is not supplied, and a gas containing the monomer A and a gas containing the monomer B are supplied to the surface-treated target surface of the wafer 1. Thus, a polymerized film 3 is formed on the target surface of the wafer 1. In Step S2, a film forming temperature is lower than 200 degrees C. A lower limit value of the film forming temperature is a temperature at which, e.g., the monomer A and the monomer B (i.e., acid dianhydride and diamine) may be dehydrated and condensed to form an imide bond.

The polymerized film forming method according to the first embodiment can prevent degradation of adhesion between the polymerized film 3 and the wafer 1 even though the film forming temperature of the polymerized film is lowered to below 200 degrees C. Hereinafter, it will be described in detail with reference to a more specific example.

<Case 1>

FIG. 3 is a flowchart illustrating Case 1 of the polymerized film forming method according to the first embodiment of the present disclosure. FIG. 4 is a timing chart illustrating timing of gas supply and exhaust in Case 1.

Case 1 supplies both of the gas containing the monomer A and the gas containing the monomer B, in addition to the gas containing the adhesion promoting agent, in the surface treatment process (Step S1a of FIG. 3).

In Case 1, as shown in the timing chart shown in FIG. 4, the gas containing the adhesion promoting agent is supplied into the processing chamber of the film forming apparatus all the time during Step S1a. Further, the gas containing the monomer A and the gas containing the monomer B are alternately supplied into the processing chamber with an exhaust (purge) process in the processing chamber therebetween. This is set as one cycle, and a predetermined number of cycles are repeated. Accordingly, the adhesion promoting agent turns into molecules by the monomer A, the monomer B, or both of the monomer A and the monomer B and is bonded to the target surface of the wafer 1. Further, in Case 1, because the gas containing the monomer A and the gas containing the monomer B are alternately supplied like a film forming process to be described later, a polymerized film is also formed while a surface treatment is performed in the surface treatment process.

As described above, an example of the adhesion promoting agent is the SC agent. An example of the SC agent has alkoxysilane. An example of the SC agent having alkoxysilane is N-phenyl-3-aminopropyl trimethoxysilane.

Further, an example of the monomer A is acid dianhydride. An example of acid dianhydride is pyromellitic acid dianhyride (PMDA).

Further, an example of the monomer B is diamine. An example of diamine is 4,4'-oxydianiline (ODA).

An example of process conditions in Step S1 is as follows:
Flow rate of the SC agent: 1 to 100 sccm
Process time: 1 to 1800 sec
Flow rate of PDMA: 1 to 100 sccm
Process time: 1 to 60 sec (per 1 cycle)
Flow rate of ODA: 1 to 100 sccm
Process time: 1 to 60 sec (per 1 cycle)
Process temperature: 100 to 250 degrees C.
Process pressure: 13 to 267 Pa (0.1 to 2.0 Torr) (1 Torr is approximately 133.3 Pa in this disclosure.)

Subsequently, Step S2 is performed. In Case 1, the film forming process alternately supplies the gas containing the monomer A and the gas containing monomer B into the processing chamber with an exhaust (purge) process in the processing chamber therebetween. This is set as one cycle, and a predetermined number of cycles are repeated. Accordingly, the polymerized film is formed on the target surface of the wafer 1 through a polymerization reaction between the monomer A and the monomer B.

An example of process conditions in Step S2 is as follows:
Flow rate of PDMA: 1 to 100 sccm
Process time: 1 to 60 sec (per 1 cycle)
Flow rate of ODA: 1 to 100 sccm
Process time: 1 to 60 sec (per 1 cycle)

Process temperature: 100 to 250 degrees C.
Process pressure: 13 to 267 Pa (0.1 to 2.0 Torr).
In such process conditions, 300 cycles are repeated.

Further, the polymerized film forming method is not limited to the method of alternately supplying the gas containing the monomer A and the gas containing the monomer B as in Case 1 Any film forming method may be employed as long as it can form the polymerized film.

<Case 2>

Figure 5:
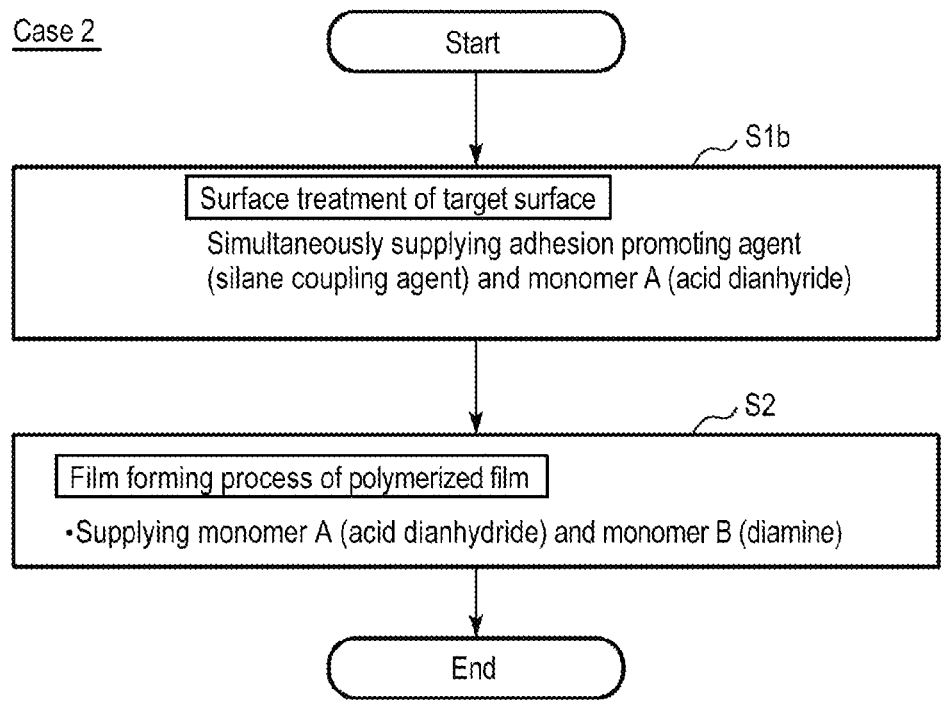
FIG. 5 is a flowchart illustrating Case 2 of the polymerized film forming method according to the first embodiment of the present disclosure.
Figure 6:
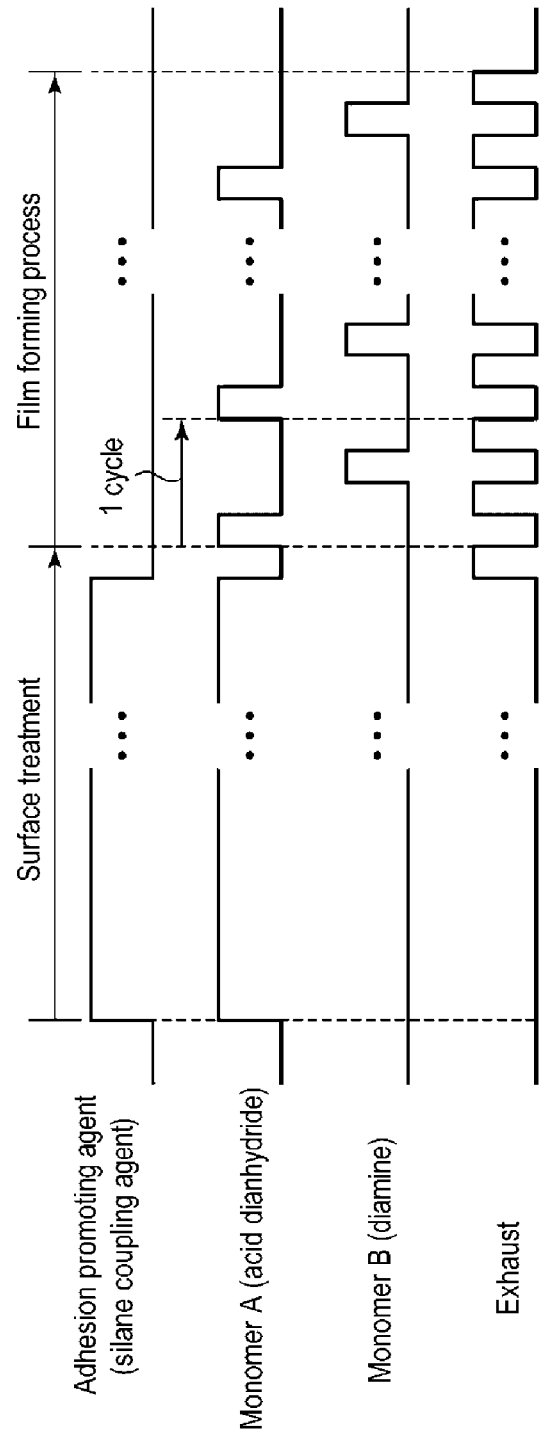
FIG. 6 is a timing chart illustrating timing of gas supply and exhaust in Case 2.

FIG. 5 is a flowchart illustrating Case 2 of the polymerized film forming method according to the first embodiment of the present disclosure. FIG. 6 is a timing chart illustrating timing of gas supply and exhaust in Case 2.

Case 2 is different from Case 1 in terms of Step S1b of FIG. 5, and other contents are the same as those of Case 1. As shown in Step S1b, Case 2 supplies the gas containing the monomer A, in addition to the gas containing the adhesion promoting agent, in the surface treatment process.

In Case 2, as shown in the timing chart of FIG. 6, the gas containing the adhesion promoting agent and the gas containing the monomer A are supplied into the processing chamber during Step S1b. In Case 2, an example of simultaneously supplying the gas containing the adhesion promoting agent and the gas containing the monomer A is employed. In Case 2, the adhesion promoting agent turns into molecules by the monomer A and is bonded to the target surface of the wafer 1. Accordingly, like Case 1, a time during which the adhesion promoting agent stays on the target surface of the wafer 1 can be lengthened, compared with a case which does not turn the adhesion promoting agent into molecules.

An example of process conditions in Step S1b is as follows:
How rate of the SC agent: 1 to 100 sccm
Flow rate of PDMA: 1 to 100 sccm
Process time: 1 to 1800 sec
Process temperature: 100 to 250 degrees C.
Process pressure: 13 to 267 Pa (0.1 to 2.0 Torr)

<Case 3>

Figure 7:
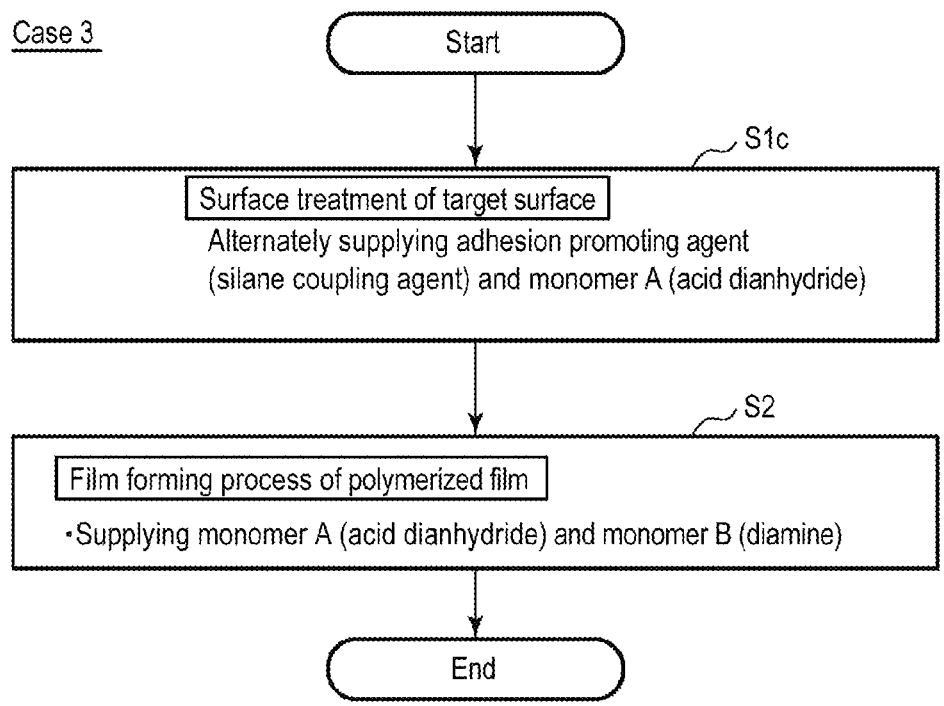
FIG. 7 is a flowchart illustrating Case 3 of the polymerized film forming method according to the first embodiment of the present disclosure.
Figure 8:
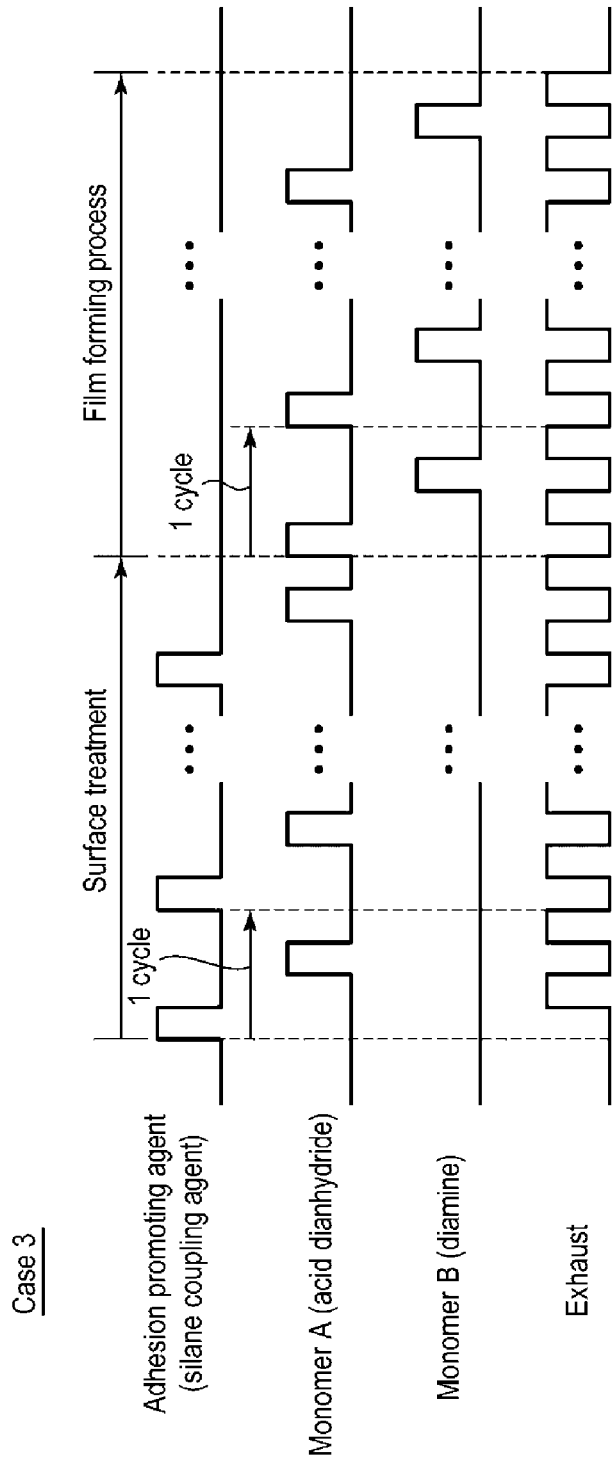
FIG. 8 is a timing chart illustrating timing of gas supply and exhaust in Case 3.

FIG. 7 is a flowchart illustrating Case 3 of the polymerized film forming method according to the first embodiment of the present disclosure. FIG. 8 is a timing chart illustrating timing of gas supply and exhaust in Case 3.

Case 3 is different from Case 1 in terms of Step S1c of FIG. 7, and other contents are the same as those of Case 1. As shown in Step S1c, Case 3 alternately supplies the gas containing the adhesion promoting agent and the gas containing the monomer A in the surface treatment process. In Case 3, one cycle is set as "supply of the gas containing the adhesion promoting agent-exhaust-supply of the gas containing the monomer A-exhaust," and a predetermined number of cycles are repeated.

Also in Case 3, because the gas containing the adhesion promoting agent and the gas containing the monomer A are alternately supplied, the adhesion promoting agent turns into molecules by the monomer A and is bonded to the target surface of the wafer 1 like Case 2.

An example of process conditions in Step S1c is as follows:
Flow rate of the SC agent: 1 to 100 sccm
Process time: 1 to 60 sec (per 1 cycle)
Flow rate of PDMA: 1 to 100 sccm
Process time: 1 to 60 sec (per 1 cycle)
Process temperature: 100 to 250 degrees C.
Process pressure: 13 to 267 Pa (0.1 to 2.0 Torr)

<Comparative Example>

Figure 9:
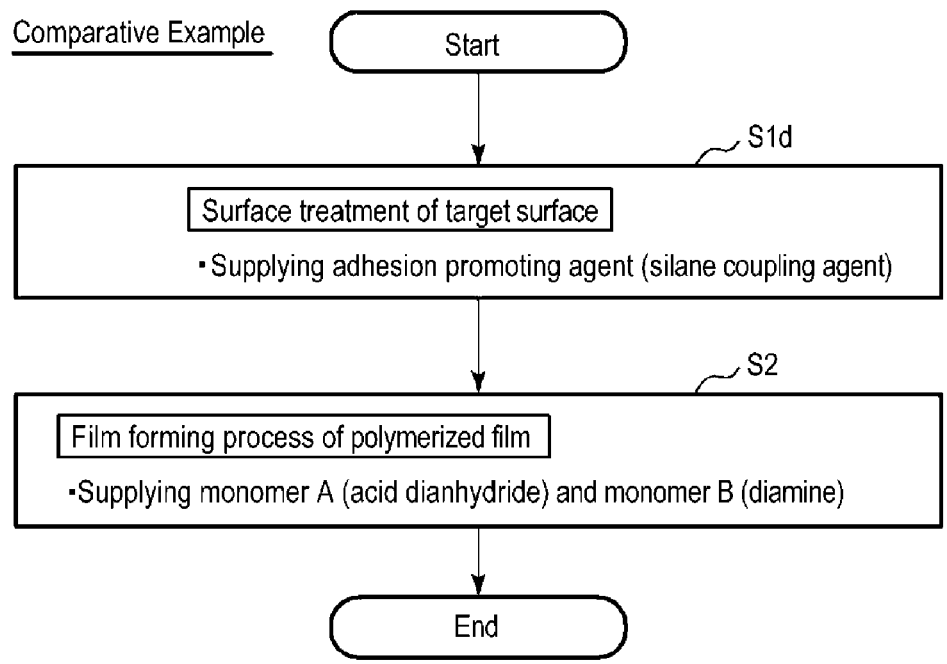
FIG. 9 is a flowchart illustrating a polymerized film forming method according to a comparative example.
Figure 10:
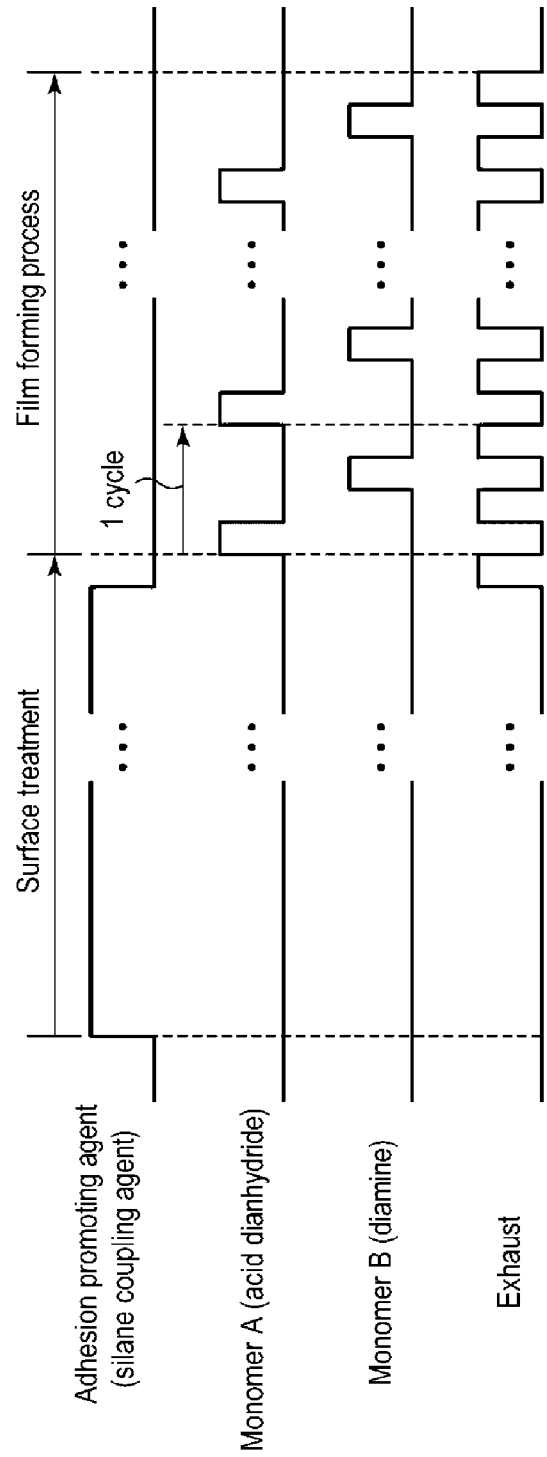
FIG. 10 is a timing chart illustrating timing of gas supply and exhaust in the comparative example.

FIG. 9 is a flowchart illustrating a polymerized film forming method according to a comparative example. FIG. 10 is a timing chart illustrating timing of gas supply and exhaust in the comparative example.

As shown in FIGS. 9 and 10, the comparative example supplies only an adhesion promoting agent in a surface treatment process.

<Results of Peel Test>

The results of peel tests of Cases 1 to 3 and the comparative example are shown in FIG. 11.

As shown in FIG. 11, when a surface treatment temperature and a film forming temperature of the polymerized film 3 are 150 degrees C., acceptable samples were 60% in the comparative example, while acceptable samples were 77% in Case 1. 17% improvement over the comparative example was confirmed. Compared with the comparative example, Case 1 exhibits higher adhesion of the polymerized film 3 with the target surface. Further, in Case 2, acceptable samples were 98%, indicating that most samples were acceptable. Further, in Case 3, acceptable samples were 100%, indicating that all the samples were acceptable.

From the results of a peel test, it was confirmed that the supply of a gas containing a polymer for forming a polymerized film, as well as a gas containing an adhesion promoting agent, in the surface treatment process effectively maintains adhesion even though the film forming temperature of the polymerized film is lowered to, e.g., below 200 degrees C. It may be inferred that because the adhesion promoting agent turns into molecules by the polymer and the time during which the adhesion promoting agent stays on the target surface is lengthened, the probability of bonding the adhesion promoting agent to the target surface can be increased even at a low temperature below 200 degrees C. as described above.

Further, FIG. 12 shows the results of a peel test in the case of lowering the surface treatment temperature and the film forming temperature of the polymerized film.

As shown in FIG. 12, when the surface treatment temperature and the film forming temperature of the polymerized film 3 were 130 degrees C. all the samples did not obtain acceptable results (0%) in the comparative example.

Also in Case 3, when the number of cycles was small (5 cycles, 12 cycles), acceptable results were not obtained, but it was confirmed that, as the number of cycles increased, acceptable results started to be obtained. For example, when 25 cycles of the surface treatment was performed, acceptable samples were 60%, and when 100 cycles of the surface treatment was performed, acceptable samples were 100%, indicating that all the samples were acceptable. Based on this result, when the surface treatment temperature and the film forming temperature of the polymerized film 3 were set to, e.g., below 150 degrees C., the case which alternately supplies the gas containing the adhesion promoting agent and the gas containing the monomer is effective.

Further, according to the first embodiment, there is an advantage that the usage amount of the SC agent is reduced compared with the comparative example in addition to the advantage that the adhesion between the polymerized film 3 and the target surface is enhanced. For example, in Case 1 and Case 2 which supply the gas containing the SC agent and the monomer A and/or the monomer B, the usage amount of the SC agent was reduced to about 50% and in Case 3 which alternately supplies the gas containing the SC agent and the monomer A, the usage amount of the SC agent was reduced to about 10%.

In addition, in order to bond the SC agent to the target surface by lengthening the time during which the SC agent stays on the target surface, the configuration of the comparative example requires increasing a concentration of the SC agent in the gas or lowering a temperature of the wafer 1 in the surface treatment process. However, increasing the concentration of the SC agent in the gas or lowering the temperature of the wafer 1 causes the gas containing the SC agent to be liquefied on the target surface.

In this respect, according to the first embodiment, the staying time of the SC agent on the target surface can be lengthened compared with the comparative example. Therefore, unlike the comparative example, it is not necessarily required to increase the concentration of the SC agent in the gas or lower the temperature of the wafer 1. Accordingly, the problem that the gas containing the SC agent on the target surface is liquefied can be solved.

<Adhesion Promoting Agent>

Subsequently, an adhesion promoting agent that is applicable to the embodiments of the present disclosure will be described.

As the adhesion promoting agent, an SC agent may be appropriately used. As the SC agent, an SC agent containing alkoxysilane may be used. Some examples of the SC agent containing alkoxysilane are shown in FIGS. 13A to 13I.

As the SC agent containing alkoxysilane,

N-phenyl-3-aminopropyl trimethoxysilane (FIG. 13A)
3-aminopropyl trimethoxysilane (FIG. 13B)
3-aminopropyl triethoxysilane (FIG. 13C)
N-2-(aminoethyl)-3-aminopropyl trimethoxysilane (FIG. 13D)
N-2-(aminoethyl)-3-aminopropyl thrimethoxysilane (FIG. 13E)
3-isocyanate propyltrimethoxysilane (FIG. 13F)
3-glycidoxypropyl trimethoxysilane (FIG. 13G)
3-glycidoxypropyl triethoxysilane (FIG. 13H)
3-glycidoxypropyl methyldimethoxysilane (FIG. 13I),
and the like may be used. As alcoxy, any one of methoxy and ethoxy may be used. Further, it is not necessary to be trialcoxy, and for example, methyl may be bonded to silicon.

Among the SC agents, the SC agent containing an amino group may turn into a molecular state by the monomer A (acid dianhydride). The amino group contained in the SC agent is dehydrated and condensed with oxygen of the monomer A (acid dianhydride). Thus, the SC agent is changed to a molecular state. As the SC agent containing the amino group, primary amines or secondary amines may be used. Further, as an SC agent that can be changed to a molecular state by the monomer A (acid dianhydride), isocyanate shown in FIG. 13F can be selected in addition to the SC agent containing the amino group.

Figure 13A:
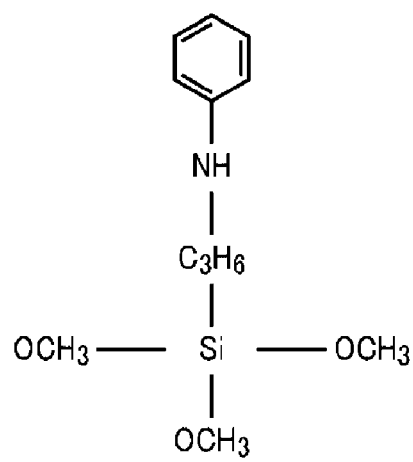
FIG. 13A to 13I illustrate examples of an SC agent containing alkoxysilane.
Figure 13B:
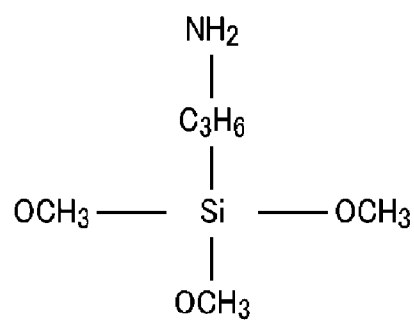
Figure 13C:
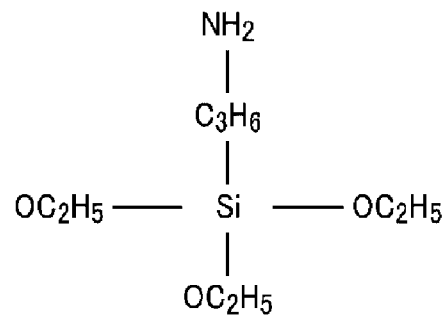
Figure 13D:
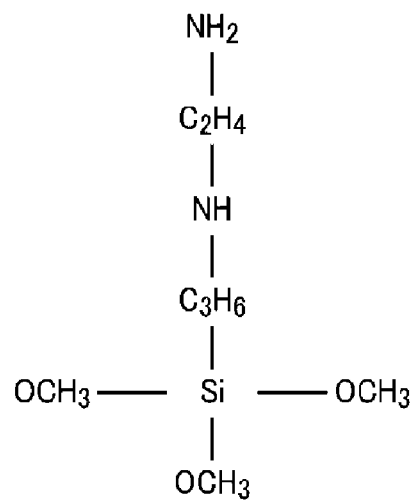
Figure 13E:
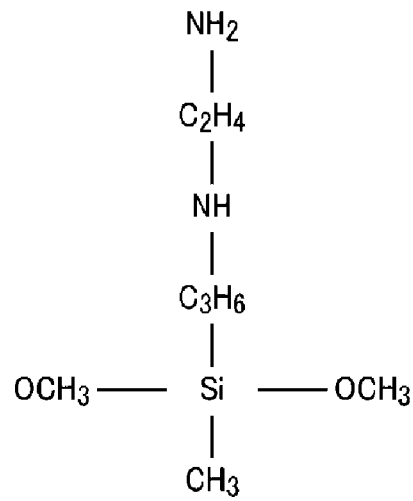
Figure 13F:
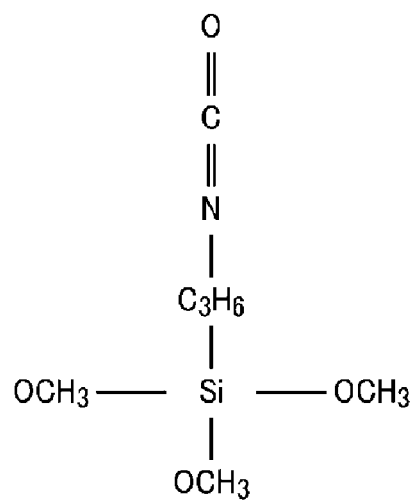
Figure 13G:
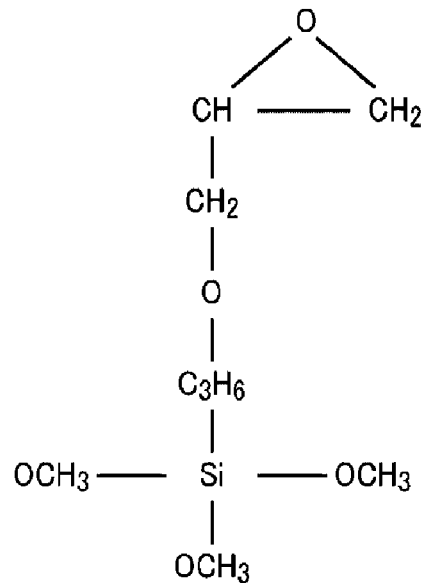
Figure 13H:
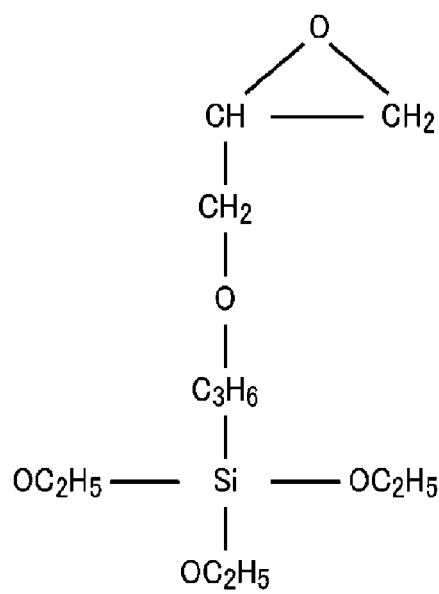
Figure 13I:
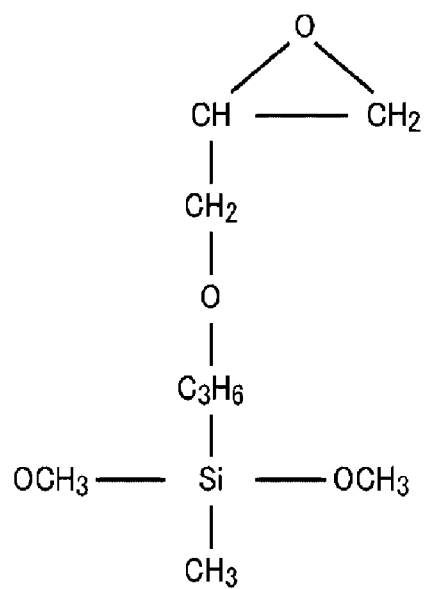

Further, as the SC agent that can be changed to a molecular state by the monomer B (diamine), the SC agent containing an epoxy group as shown in FIGS. 13G to 13I may be selected.

In the polymerized film forming method according to the first embodiment of the present disclosure, the SC agents as described above may be used as the adhesion promoting agent.

(Second Embodiment)
<Film Forming Apparatus>

Subsequently, a film forming apparatus capable of performing the polymerized film forming method in accordance with the first embodiment of the present disclosure will be described as a second embodiment of the present disclosure.

Figure 14:
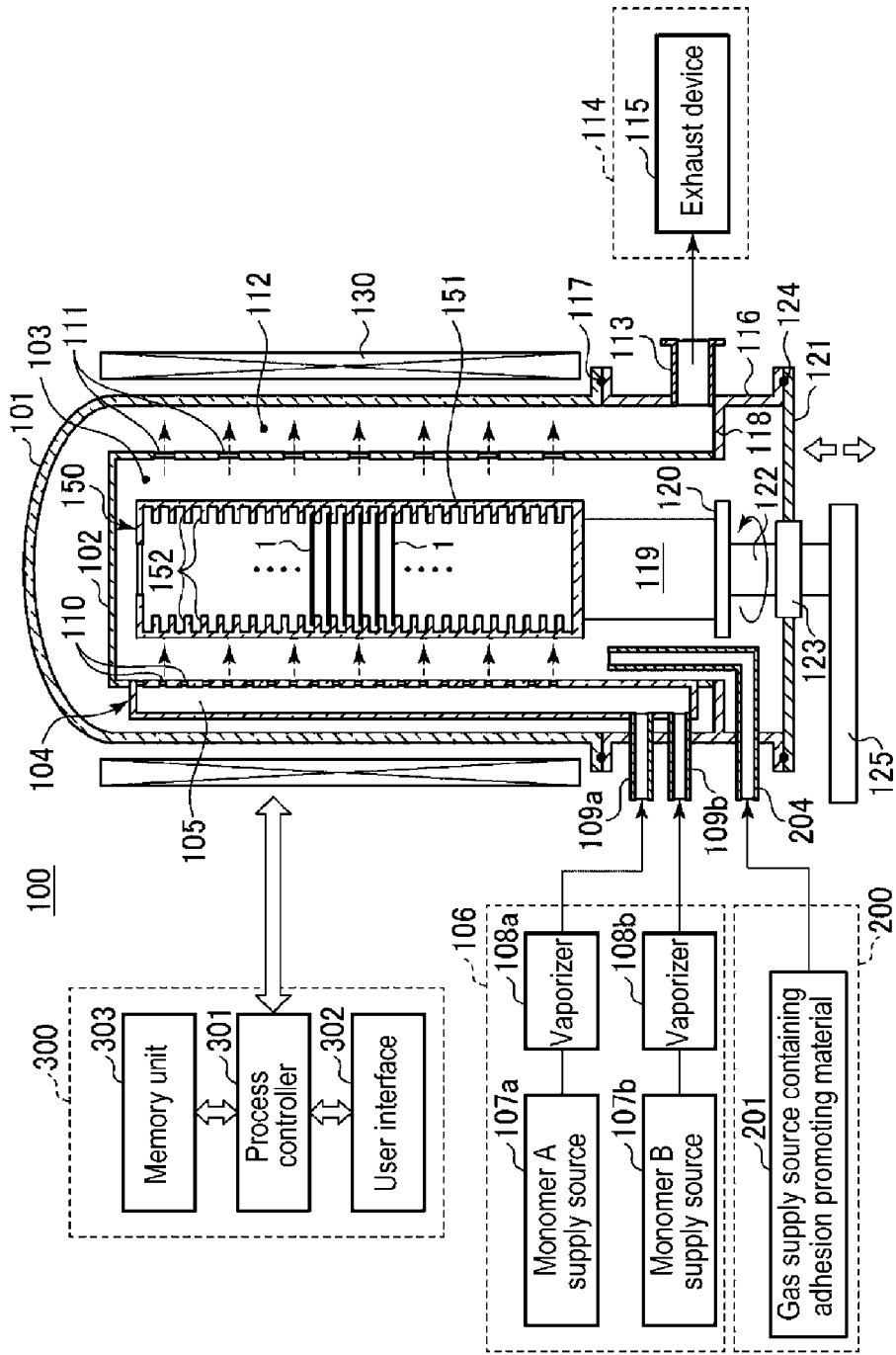
FIG. 14 is a sectional view schematically illustrating an example of a film forming apparatus according to a second embodiment of the present disclosure.

FIG. 14 is a sectional view schematically illustrating an example of a film forming apparatus according to the second embodiment of the present disclosure.

As shown in FIG. 14, a film forming apparatus 100 is a longitudinal batch-type film forming apparatus that performs a film forming process with a plurality of target objects stacked on a boat in a height direction. The film forming apparatus 100 includes a cylindrical outer tube 101 provided with a ceiling, and a cylindrical inner tube 102 installed inside the outer tube 101 and provided with a ceiling. The outer tube 101 and the inner tube 102 are made of, e.g., quartz. The inside of the inner tube 102 serves as a processing chamber 103 which accommodates target objects, e.g., a plurality of wafers 1 and performs a film forming process of a polymerized film with respect to all of the accommodated wafers 1. In this example, a polymerized film, e.g., a polyimide film, is formed on the target surface of each of the wafers 1 using a deposition polymerization method.

As a gas introduction unit for introducing a film forming process gas into the processing chamber 103, an injector 104 extending in a height direction, e.g., in a vertical direction, is installed at one side of a sidewall of the inner tube 102. The injector 104 includes a gas diffusion space 105 in its interior. The gas diffusion space 105 is connected to a film forming process gas supply mechanism 106.

The film forming process gas supply mechanism 106 of this example includes a monomer A supply source 107a which is a supply source of a monomer A and a monomer B supply source 107b which is a supply source of a monomer B. In this example, a polyimide film is formed as a polymerized film. For this purpose, the monomer A is selected from those that may be polymerized with the monomer B to form an imide bond.

The monomer A supply source 107a and the monomer B supply source 107b store a monomer A or a monomer B which are a liquid state or dissolved in a solvent. These monomers A and B are fed to vaporizers 108a and 108b. The vaporizers 108a and 108b vaporize the fed monomers A and B. The vaporizers 108a and 108b are connected to gas supply pipes 109a and 109b, respectively. The gas supply pipes 109a and 109b are connected to the gas diffusion space 105. The vaporized monomers A and B are supplied together with a carrier gas, e.g., a nitrogen gas, into the gas diffusion space 105 through the gas supply pipes 109a and 109b. The vaporized monomers A and B are injected into the inside of the processing chamber 103, e.g., in a horizontal direction, through a plurality of discharge holes 110 formed in the injector 104.

A plurality of exhaust holes 111 for evacuating the inside of the processing chamber 103 are formed at the other side of the sidewall of the inner tube 102. The plurality of exhaust holes 111 communicate with a space defined by the outer tube 101 and the inner tube 102, respectively. The space serves as an exhaust space 112. The exhaust space 112 is connected through an exhaust pipe 113 to an exhaust mechanism 114 that evacuates the inside of the processing chamber 103. The exhaust mechanism 114 includes an exhaust device 115, e.g., a vacuum pump. The exhaust mechanism 114 not only evacuates the internal atmosphere of the processing chamber 103 but also sets the internal pressure of the processing chamber 103 to a pressure required in the process.

The open end portion (bottom side) of the outer tube 101 is connected through a seal member 117 such as an O-ring to, e.g., a manifold 116 which is formed into a cylindrical shape by stainless steel. The manifold 116 supports the bottom side of the outer tube 101. Furthermore, the open end portion of the inner tube 102 is connected to, e.g., an inner tube support portion 118 formed in a flange shape on the inner circumferential surface of the manifold 116.

A boat 150 capable of holding a plurality of target objects, e.g., wafers 1, in a stack can be inserted from the lower side of the manifold 116 into the processing chamber 103 through the inside of the inner tube support portion 118. The boat 150 is made of quartz and includes a plurality of posts 151. A plurality of grooves 152 are formed in the posts 151. The plurality of wafers 1 are supported by the plurality of grooves 152.

The boat 150 is placed on a table 120 with a heat-insulating cylinder 119 made of quartz therebetween. The table 120 is supported on a rotation shaft 122 passing through a lid 121 that opens and closes a lower end opening of the manifold 116 and is made of, e.g., stainless steel. For example, a magnetic fluid seal 123 is installed in a through-hole portion of the lid 121 through which the rotation shaft 122 passes. The magnetic fluid seal 123 rotatably supports the rotation shaft 122 while hermetically sealing the rotation shaft 122. A seal member 124 formed of, e.g., an O-ring, is installed between the peripheral portion of the lid 121 and the lower end of the manifold 116. Thus, the inside of the processing chamber 103 is kept sealed. The rotation shaft 122 is installed at the tip of an arm 125, for example, which is supported by an elevator mechanism (not shown) such as a boat elevator. Consequently, the boat 150 and the lid 121 are unitarily moved up and down, and are inserted into or removed from the inside of the processing chamber 103.

A heating device 130 is installed around the outer circumference of the outer tube 101 so as to surround the outer tube 101. The heating device 130 heats the plurality of wafers 1 accommodated in the processing chamber 103.

The film forming apparatus 100 includes a gas supply mechanism 200 that supplies a gas containing an adhesion promoting agent. The gas supply mechanism 200 includes an adhesion promoting agent-containing gas supply source 201. The adhesion promoting agent-containing gas supply source 201 includes a retention container which retains an adhesion promoting agent, e.g., an SC agent, a heating device which heats and vaporizes the SC agent retained in the retention container, and so forth. The vaporized SC agent is sent together with a carrier gas, e.g., a nitrogen gas, to a supply nozzle 204.

The supply nozzle 204 is formed of, e.g., quartz pipe. The supply nozzle 204 passes through a sidewall of the manifold 116, is bent upward, and extends vertically. A gas containing an adhesion promoting agent is supplied into the processing chamber 103 from the supply nozzle 204.

A control unit 300 is connected to the film forming apparatus 100. The control unit 300 includes a process controller 301 consisting of, e.g., a microprocessor (or a computer). The process controller 301 controls respective component parts of the film forming apparatus 100. A user interface 302 and a memory unit 303 are connected to the process controller 301.

The user interface 302 includes an input unit including a touch panel display, a keyboard or the like for enabling an operator to input a command or perform other operations in order to manage the film forming apparatus 100, and a display unit including a display for visually displaying the operating situation of the film forming apparatus 100.

The memory unit 303 stores a so-called process recipe which includes a control program for realizing, under the control of the process controller 301, various kinds of processes such as a film forming process implemented by the film forming apparatus 100, and a program for causing the respective component parts of the film forming apparatus 100 to execute processes according to process conditions. The process recipe is stored in a storage medium of the memory unit 303. The storage medium may be a hard disk or a semiconductor memory. The storage medium may be a portable storage medium such as a CD-ROM, a DVD, a flash memory or the like. In addition, the process recipe may be appropriately transmitted from other devices, e.g., via a dedicated line.

If necessary, the process recipe is read out from the memory unit 303 in response to an operator's instruction transmitted from the user interface 302. The process controller 301 performs the process according to the read-out process recipe, whereby the film forming apparatus 100 performs a required process, e.g., the polymerized film forming method according to the first embodiment described above, under the control of the process controller 301.

The polymerized film forming method according to the first embodiment of the present disclosure can be implemented by, e.g., the film forming apparatus 100 as shown in FIG. 14.

While some embodiments of the present disclosure have been described, the present disclosure is not limited to the aforementioned embodiments and may be differently modified without departing from the spirit and scope of the present disclosure.

For example, in the embodiments described above, a batch-type film forming apparatus 100 that holds a plurality of wafers 1 and simultaneously performs film formation with respect to all of the wafers 1 has been explained as a film forming apparatus which embodies the present disclosure. However, the film forming apparatus is not limited to a batch-type apparatus and may be a single-wafer-type film forming apparatus that performs film formation on a wafer-by-wafer basis, i.e., on wafers one by one.

Moreover, the target object is not limited to the wafer 1. The present disclosure may be applied to other substrates such as an LCD glass substrate and the like. In addition, the present disclosure may be differently modified without departing from the spirit and scope thereof.

According to the present disclosure in some embodiments, it is possible to provide a polymerized film forming method capable of preventing degradation of adhesion between a polymerized film and a target surface even though a temperature for forming the polymerized film is lowered, and a film forming apparatus capable of performing the polymerized film forming method.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A polymerized film forming method for forming a polymerized film on a target surface of a target object by using a first raw material gas containing acid dianhydride and a second raw material gas containing diamine, the method comprising:

performing a surface treatment on the target surface by
supplying a gas containing an adhesion promoting agent for enhancing adhesion between the target surface and the polymerized film; and after performing the surface treatment, supplying the first raw material gas and the second raw material gas to the surface-treated target surface to form the polymerized film, wherein when performing the surface treatment, at least one of the first raw material gas and the second raw material gas is supplied in addition to the gas containing the adhesion promoting agent, such that the adhesion promoting agent is bonded to the target surface while the adhesion promoting agent turns into molecules by the one of the first raw material gas and the second raw material gas.

2. The method of claim 1, wherein when supplying the first and second raw material gases, a film forming temperature is equal to or higher than a temperature at which the acid dianhydride and the diamine are dehydrated and condensed, and lower than 200 degrees C.

3. The method of claim 1, wherein when performing the surface treatment, the gas containing the adhesion promoting agent, and both of the first raw material gas and the second raw material gas are supplied, and the polymerized film is formed on the target surface while performing the surface treatment of the target surface.

4. The method of claim 1, wherein the gas containing the adhesion promoting agent and the one of the first raw material gas and the second raw material gas are simultaneously supplied.

5. The method of claim 1, wherein the gas containing the adhesion promoting agent and the one of the first raw material gas and the second raw material gas are alternately supplied.

6. The method of claim 1, wherein the adhesion promoting agent contains alkoxysilane.

7. The method of claim 1, wherein when performing the surface treatment, the first raw material gas and the gas containing the adhesion promoting agent are supplied, and the adhesion promoting agent contains an amino group.

8. The method of claim 7, wherein the adhesion promoting agent containing the amino group is primary amine or secondary amine.

9. The method of claim 1, wherein when performing the surface treatment, the first raw material gas and the gas containing the adhesion promoting agent are supplied, and the adhesion promoting agent is isocyanate.

10. The method of claim 1, wherein when performing the surface treatment, the second raw material gas and the gas containing the adhesion promoting agent are supplied, and the adhesion promoting agent contains an epoxy group.

* * * * *